(12) United States Patent
Bernstein et al.

(10) Patent No.: US 9,301,424 B2
(45) Date of Patent: Mar. 29, 2016

(54) AUTO-COMPENSATING TEMPERATURE VALVE CONTROLLER FOR ELECTRO-RHEOLOGICAL FLUID MICRO-CHANNEL COOLED INTEGRATED CIRCUIT

(71) Applicant: International Business Machines Corporation, Armonk, NY (US)

(72) Inventors: Kerry Bernstein, Arlington, VA (US); Kenneth J. Goodnow, Essex Junction, VT (US); Clarence R. Ogilvie, Huntington, VT (US); John Sargis, Jr., Essex, VT (US); Sebastian T. Ventrone, South Burlington, VT (US); Charles S. Woodruff, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/882,658

(22) Filed: Oct. 14, 2015

(65) Prior Publication Data

US 2016/0037682 A1 Feb. 4, 2016

Related U.S. Application Data

(62) Division of application No. 14/068,056, filed on Oct. 31, 2013.

(51) Int. Cl.
*H01L 35/00* (2006.01)
*H05K 7/20* (2006.01)
*H01L 23/473* (2006.01)

(52) U.S. Cl.
CPC .......... *H05K 7/20281* (2013.01); *H01L 23/473* (2013.01); *H05K 7/20272* (2013.01)

(58) Field of Classification Search
USPC ......................................................... 327/513
See application file for complete search history.

(56) References Cited

U.S. PATENT DOCUMENTS 5,875,740 A * 3/1999 Ban .......................... F24J 3/003
122/26
7,334,627 B2 2/2008 Liu et al.
(Continued)

FOREIGN PATENT DOCUMENTS

JP H0410969 4/1992

OTHER PUBLICATIONS

Mohseni K., Effective Cooling of Integrated Circuits Using Liquid Alloy Electrowetting; 21st IEEE Symposium on Semiconductor Thermal Measurement and Management Symposium, Mar. 15-17, 2005, pp. 20-25.

(Continued)

*Primary Examiner* — Lincoln Donovan
*Assistant Examiner* — Patrick Chen
(74) *Attorney, Agent, or Firm* — Schmeiser, Olsen & Watts; Steven Meyers

(57) ABSTRACT

A structure and method of using the structure. The structure including an integrated circuit chip having a set of micro-channels; an electro-rheological coolant fluid filling the micro-channels; first and second parallel channel electrodes on opposite sides of at least one micro-channel, the first channel electrode connected to an output of an auto-compensating temperature control circuit, the second channel electrode connected to ground; the auto-compensating temperature control circuit comprising a temperature stable current source connected between a positive voltage rail and the output and having a temperature sensitive circuit connected between ground and the output, a leakage current of the temperature stable current source being essentially insensitive to temperature and a leakage current of the temperature sensitive circuit increasing with temperature.

20 Claims, 9 Drawing Sheets

(56) References Cited

U.S. PATENT DOCUMENTS

| | | | |
|---|---|---|---|
| 7,696,015 B2* | 4/2010 | Kim | F04B 17/00 257/467 |
| 7,802,970 B2 | 9/2010 | Singhal et al. | |
| 2003/0022052 A1* | 1/2003 | Kearl | H01M 8/0204 429/423 |
| 2006/0099808 A1 | 5/2006 | Kondo | |
| 2008/0101022 A1 | 5/2008 | Cernasov | |
| 2014/0118034 A1* | 5/2014 | Lemkin | G05F 3/24 327/143 |
| 2015/0116939 A1 | 4/2015 | Bernstein et al. | |

OTHER PUBLICATIONS

Lee T., Design Optimization of an Integrated Liquid-Cooled IGBT Power Module Using CFD Technique. IEEE Transactions on Components and Packaging Technologies, vol. 23, No. 1, Mar. 2000, pp. 55-60.

* cited by examiner

AUTO-COMPENSATING TEMPERATURE VALVE CONTROLLER FOR ELECTRO-RHEOLOGICAL FLUID MICRO-CHANNEL COOLED INTEGRATED CIRCUIT

RELATED APPLICATIONS

This application is a Division of U.S. patent application Ser. No. 14/068,056 filed on Oct. 31, 2013.

FIELD OF THE INVENTION

The present invention relates to the field of integrated circuits; more specifically, it relates to methods for local temperature control of integrated circuits and locally temperature controlled electro-rheological micro-channel anisotropic cooled integrated circuits.

BACKGROUND

Timing variability in high performance logic chips is impacted in part by device junction temperature variations across the chip. These temperature differences induce changes in device transconductance which perturb circuit delays in cycle-limiting paths. Cooling techniques in present use only ensure that chip temperatures do not exceed levels that compromise reliability, but do not address the problem of local temperature variations due to differential device activity. Accordingly, there exists a need in the art to mitigate the deficiencies and limitations described hereinabove.

SUMMARY

A first aspect of the present invention is a structure comprising: an integrated circuit chip having a set of micro-channels; an electro-rheological coolant fluid filling the micro-channels; first and second parallel channel electrodes on opposite sides of at least one micro-channel, the first channel electrode connected to an output of an auto-compensating temperature control circuit, the second channel electrode connected to ground; and the auto-compensating temperature control circuit comprising a temperature stable current source connected between a positive voltage rail and the output and having a temperature sensitive circuit connected between ground and the output, a leakage current of the temperature stable current source being essentially insensitive to temperature and a leakage current of the temperature sensitive circuit increasing with temperature.

A second aspect of the present invention is a method, comprising providing an integrated circuit chip comprising: a set of micro-channels; an electro-rheological coolant fluid filling the micro-channels; first and second parallel channel electrodes on opposite sides of at least one micro-channel, the first channel electrode connected to an output of an auto-compensating temperature control circuit, the second channel electrode connected to ground; the auto-compensating temperature control circuit comprising a temperature stable current source connected between a positive voltage rail and the output and having a temperature sensitive circuit connected between ground and the output, a leakage current of the temperature stable current source being essentially insensitive to temperature and a leakage current of the temperature sensitive circuit increasing with temperature; and adjusting the flow of electro-rheological coolant fluid automatically based on the temperature of the auto-compensating temperature control circuit.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

Figure 1A:
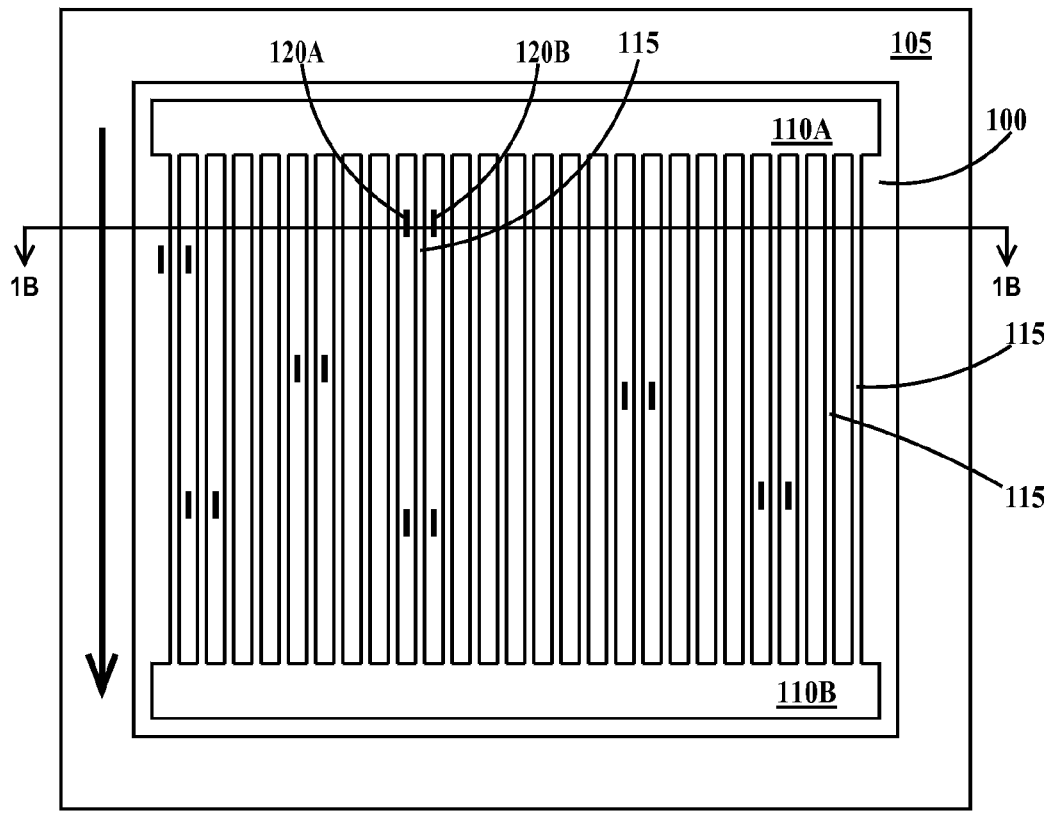
FIG. 1A is a top view and FIG. 1B is a cross-section view through line 1B-1B of FIG. 1A illustrating an exemplary micro-channel cooled integrated circuit according to embodiments of the present invention.

The embodiments of the present invention provide circuits to automatically control the flow of electro-rheological (ER) cooling fluids in micro-channels of integrated circuits in response to local integrated circuit temperatures based on temperature dependent leakage currents of the devices of the circuits.

An ER fluid comprises a suspension of extremely fine non-conducting particles (e.g., about 0.1 micron to about 5 micron) in an electrically insulating fluid. The apparent viscosity of an ER fluid changes reversibly by an order of up to 100,000 in response to an electric field. For example, a typical ER fluid can go from the consistency of a liquid (low viscosity) to that of a gel (high viscosity), and back, with response times on the order of milliseconds.

Application of an electric field across a micro-channel causes the ER fluid to change from a liquid state to a gel state, blocking the channel and stopping ER fluid flow through the channel. With no electric field applied, the ER fluid is in the liquid state and free to flow and thus cool the region of the chip proximate to the micro-channel. An ER fluid comprises particles mixed with a suspension liquid and may also include surfactants and additives.

Examples of particle materials that may be used in an ER fluid include, but are not limited to: alpha-silica, maleic anhydride, alginic acid, mannitol, alumina, metallic semiconductors, alumina silica mixtures, methoxyphenylimidoperylene, aluminum oleate, methyl acrylate, aluminum octoate, methyl methacrylate, aluminum stearate, microcel-C, azaporhin systems, microcrystalline cellulose, barium titanate, micronized mica, boron, monosaccharides, cadmiumsulphidephosphor, calcium stearate N-vinylpyrrolidole, carbon, cellulose, olefins, ceramics, phenolformaldehyde polymers, chloride phthalocyanine, colloidal kaolin clay, polystyrene polymers, colloidal silica, porhin, crystalline D-sorbitol, phosphototungstomolybic acid, diallylether, polymethacrylate mixtures, dimethyl hydontoin resin, polyvinyl alcohols, diethylcarbocyanineiodide, pyrogenic silica, diphenylthiazoleanthraquinone, quartz, divinylbenzene, substituted quinacridone, flavanthrone, silica aerogel, silica gel, silica xerogel, glass, silicone ionomers, copper phthalocyanine, sorbitol, gypsum, Teflon, lauryl pyridinium, lead oxide, water-saturated silica, white bentonite, lithium polymethacrylate, zinc oxide, lithium stearate, zinc sulphidephosphor, magnesium silicate, zinc stearate, and maleic acid.

Examples of suspension liquids that may be used in an ER fluid include, but are not limited to: aldehydes, aliphatic esters, ketones, carbon tetrachloride, liquid paraffin, chlorobentzenediphenyl alkanes, mineral oil, chloroform, olefins, di-2-ethylhexyl adipate, dibutyl sebacate, orthochlorotoluene, polyalkylene glycols, ethers, polychlorinated biphenyls, diphenyl ethers, polychlorotrifluoroethylene, diphenyl sulphoxides, diphenyl sulphones, silicone oils, fluorinated hydrocarbons, fluorinated polymers, trifluorovinyl chloride, fluorosilicones and xylene.

Examples of surfactants that may be added to ER fluids include, but are not limited to: block copolymers, glyserol mono-oleates, borax, hydrocarbon polymers, dodecyl alcohol, lead napthenate, metal hydrates, octyl alcohol, glycerol, sodium oleate, glyserol esters and tin oxide.

Examples of additives that may be added to ER fluids include, but are not limited to: acetates, lactic acid, acetic acid, LiCl, alcohols, malic acid, aliphatic compounds, malonic acid, amines, metal chlorides. ammonium ion, monoethyl ether, butylamine, morpholine, calcium hydroxide, NaCl, diethylene glycol, NaOH, fluorides, octanoic acid, formic acid, oxalic acid, glycerine, pyruvic acid, hexylamine, trichloroasetic acid, KCl, water and KOH.

Just because a given mixture contains the materials listed supra, does not mean that that mixture will exhibit electro-rheological activity (a change in viscosity in response to an electric field) as particle size, weight percentage of particle, particle size and the types and amounts of surfactants and additives will affect such activity. Electro-rheological fluids must be shown to exhibit electro-rheological activity.

Figure 1B:
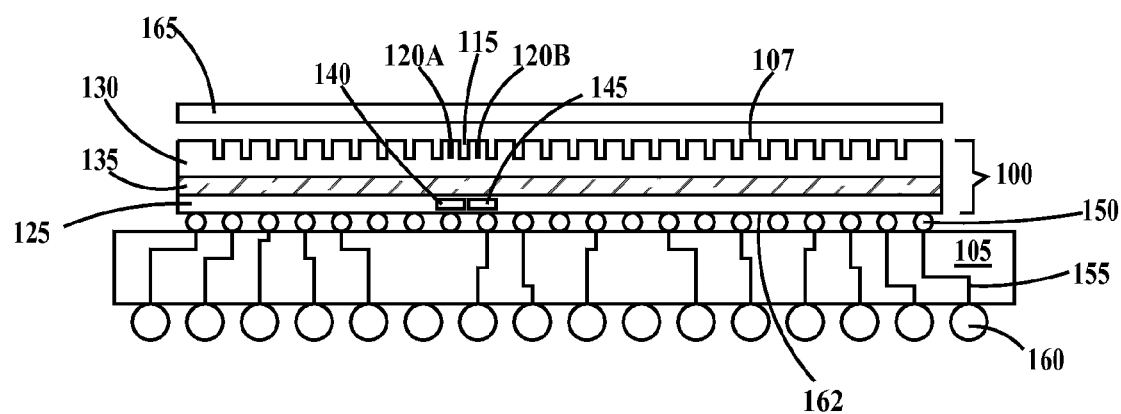

FIG. 1A is a top view and FIG. 1B is a cross-section view through line 1B-1B of FIG. 1A illustrating an exemplary micro-channel cooled integrated circuit according to embodiments of the present invention. In FIG. 1A, an integrated circuit chip 100 mounted on a module (or carrier) 160. Formed in the backside 107 of chip 100 are first ER fluid reservoir 110A connected to a second ER fluid reservoir 110B by a plurality of micro-channels 115. ER fluid reservoir 110A and 110B and micro-channels 115 are integrally formed (e.g., etched) in the backside of chip 100. Pairs of electrodes 120A and 120B are formed on opposite sides of micro-channels 115 in selected locations. In FIG. 1B, chip 100 comprises a semiconductor layer 125 separated from a supporting substrate 130 by a buried oxide (BOX) layer 135. In one example, semiconductor layer 125 is single crystal silicon. In one example, supporting substrate 130 is single crystal silicon. Formed in semiconductor layer 125 is a temperature sensing circuit 140 and a functional circuit (e.g., logic or memory circuit) or region 145 of integrated circuit chip 100. Autocompensating temperature control circuit 140 responds automatically to local temperature changes of functional circuit/region 145 and controls a voltage differential applied to a corresponding pair of electrodes 120A and 120B to (i.e., those electrodes that control the flow of cooled ER fluid in adjacent to functional circuit/region 145) as described infra. Chip 100 is physically mounted to and electrically connected to carrier 105 by solder bumps 150. Wires 155 in carrier 105 connected to balls 160 on a bottom side 162 of carrier 105. A generic lid 165 is illustrated in FIG. 1B. Lid 165 provides a hermetic seal so as to contain an ER fluid in reservoirs 110A and 110B and micro-channels 115. The arrow on the left indicates the direction of flow through micro-channels 115. In one example, carrier 105 is a multi-layer ceramic module. In one example, carrier 105 is a multi-layer printed circuit board (PCB).

In FIG. 1B, chip 100 is formed in a semiconductor-on-insulator (SOI) substrate. In order to obtain good thermal transfer, the distance between the micro-channels and the devices (e.g., field effect and/or bipolar transistors) of circuit or region 145 in semiconductor layer should be a small as possible. In one example, the thickness of semiconductor layer 125 is between about 2 microns and about 7 microns. In one example, the thickness of BOX layer 135 is between about 0.1 microns and about 0.5 microns. In one example, the thickness of supporting substrate 130 is between about 500 microns and about 750 microns. Alternatively, chip 100 may be formed on a bulk silicon substrate (no buried oxide layer) having a thickness between about 600 microns and about 800 microns.

Figure 2A:
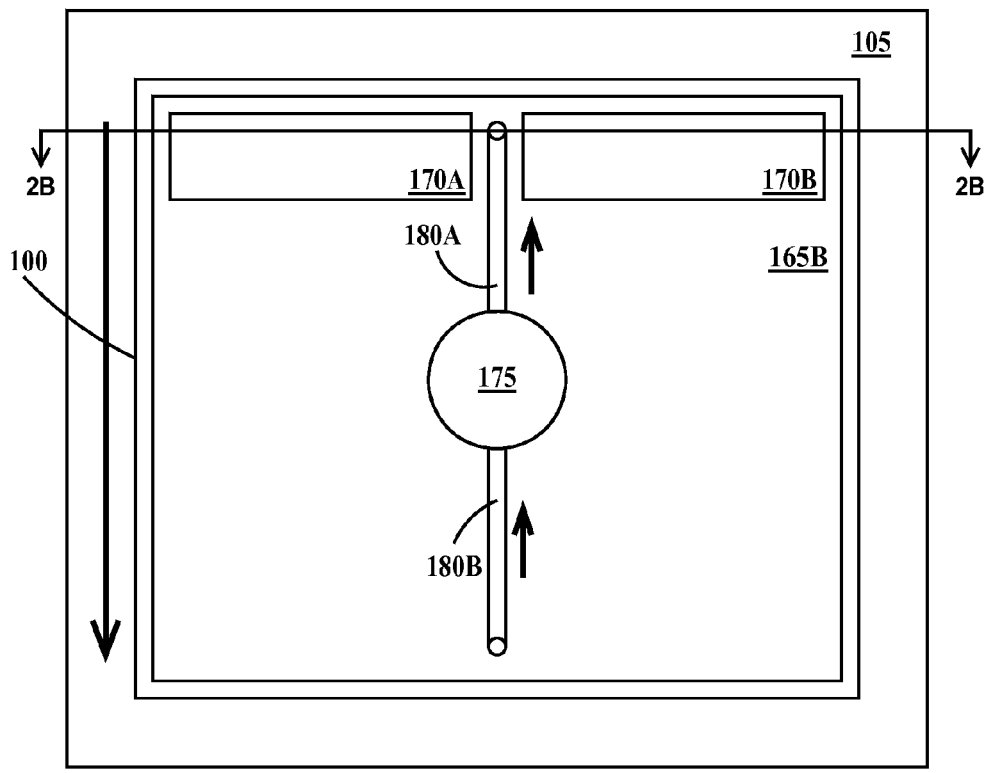
FIG. 2A is a top view and FIG. 2B is a cross-section view through line 2B-2B of FIG. 2A illustrating an exemplary micro-channel cooled integrated circuit using a Peltier device according to embodiments of the present invention.
Figure 2B:
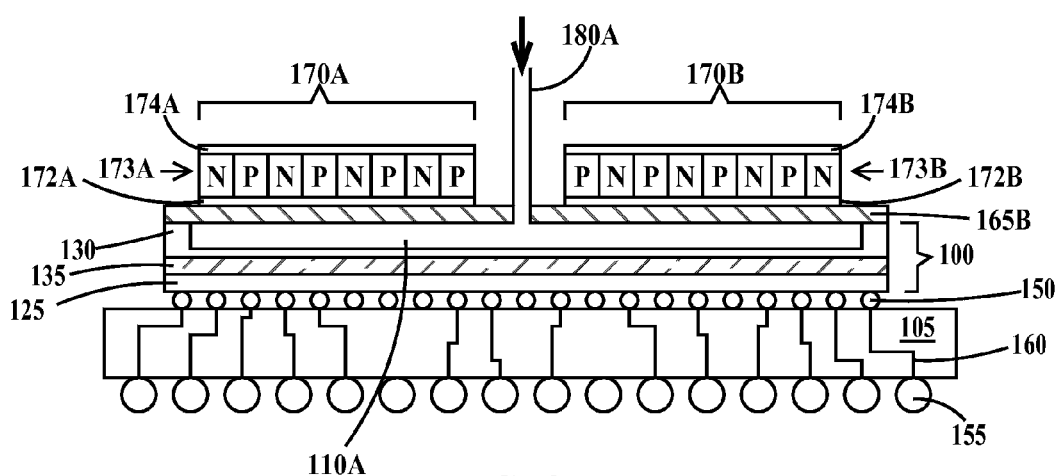

FIG. 2A is a top view and FIG. 2B is a cross-section view through line 2B-2B of FIG. 2A illustrating an exemplary micro-channel cooled integrated circuit using a Peltier device according to embodiments of the present invention. Line 2B-2B passes through first reservoir 110A. In FIGS. 2A and 2B, lid 165 of FIG. 1B has been replaced with a heat conductive lid (e.g., metal) 165B. A pair of Peltier devices 170A and 170B have been mounted on lid 165B over first reservoir 110A. Peltier device 170A includes a cooling plate 172A in contact with lid 165B, a heat dissipating plate 174A and an alternating N-doped/P-doped N semiconductor layer 173A between plates 172A and 174A. Likewise Peltier device 170B includes a cooling plate 172B in contact with lid 165B, a heat dissipating plate 174B and an alternating P-doped N-doped semiconductor layer 173B between plates 172B and 174B. A pump 175 is mounted to lid 165B and pumps ER cooling fluid from second reservoir 110B (see, for example, FIG. 1A) through pipe 180B to first reservoir 110B through pipe 180A. In one example, power for Peltier devices 170A and 170B and pump 175 is supplied externally, though circuits in chip 100 may be used to turn the Peltier devices and pump on and off. In one example, for Peltier devices 170A and 170B and pump are wired to carrier 105.

Figure 3A:
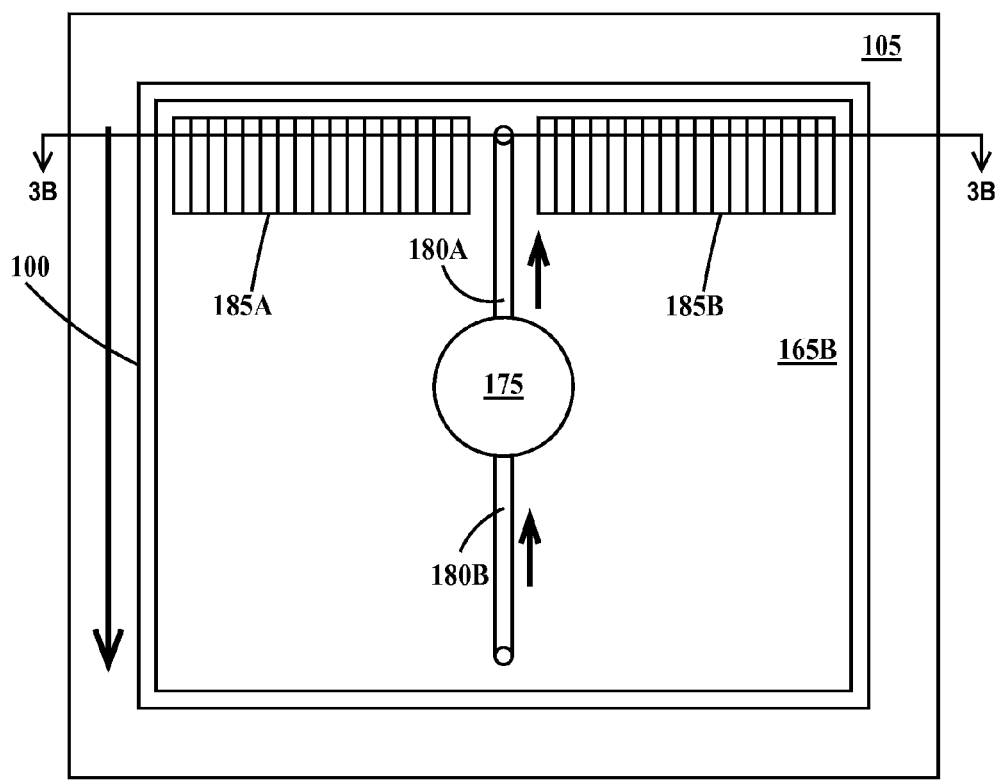
FIG. 3A is a top view and FIG. 3B is a cross-section view through line 3B-3B of FIG. 3A illustrating an exemplary micro-channel cooled integrated circuit using a heat sink according to embodiments of the present invention.
Figure 3B:
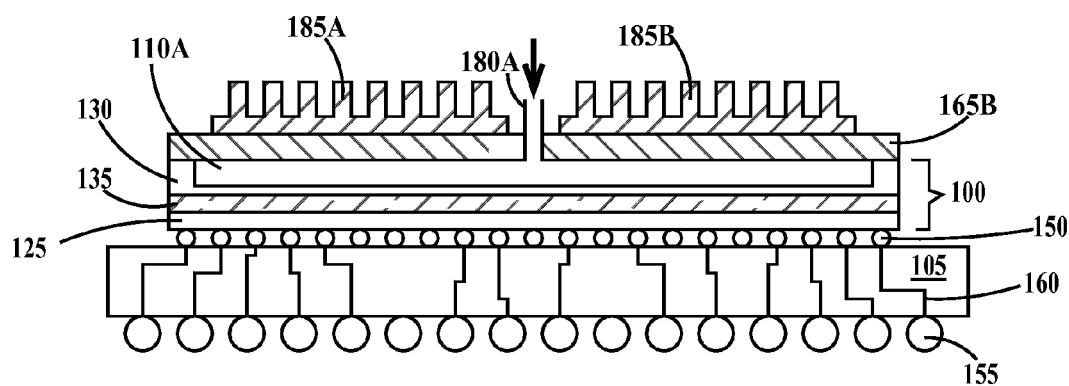

FIG. 3A is a top view and FIG. 3B is a cross-section view through line 3B-3B of FIG. 3A illustrating an exemplary micro-channel cooled integrated circuit using a heat sink according to embodiments of the present invention. FIGS. 3A and 3B are similar to FIGS. 2A and 2B respectively, except Peltier devices 170A and 170B of FIGS. 2A and 2B are replaced with heat sinks 185A and 185B respectively.

Figure 4:
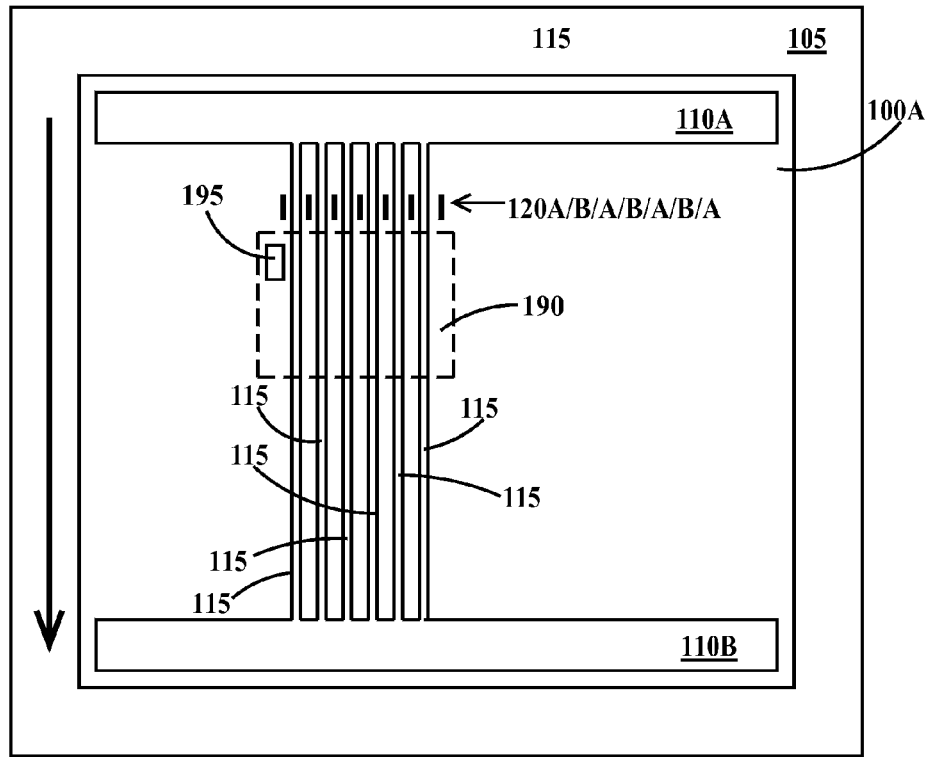
FIG. 4 is a top view of an exemplary micro-channel cooled integrated circuit according to embodiments of the present invention.

FIG. 4 is a top view of an exemplary micro-channel cooled integrated circuit according to embodiments of the present invention. For clarity, no lid or cooling devices are shown in FIG. 4. FIG. 4 gives an example, wherein micro-channels 115 are formed only in certain regions of the chip that need cooling. In FIG. 4, an integrated circuit chip 110A includes a functional circuit (or region of integrated circuit chip 100) 190 and an auto-compensating temperature control circuit 195. There are multiple micro-channels 115 passing over functional circuit/region 190. Multiple channel electrodes 120A and 120B alternate between micro-channels 115. All the electrodes 120A are wired together and all the electrodes 120B are wired together so an electric field can be generated across opposing pairs of all the micro-channels 115 simultaneously when a voltage differential is applied between electrodes 120A and 120B to shut off ER coolant fluid flow. While one set of functional circuit/region 190, auto-compensating temperature control circuit 195 and corresponding micro-channels 115 and electrodes 120A/B are illustrated, there may be multiple independent such sets.

Figure 5A:
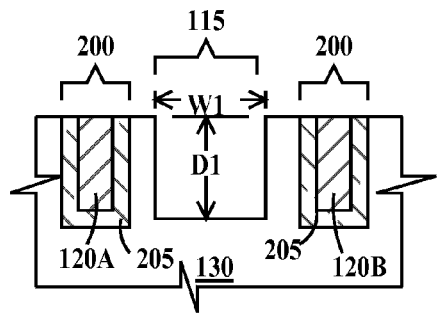
FIGS. 5A and 5B are a cross-section through a micro-channel according to embodiments of the present invention.
Figure 5B:
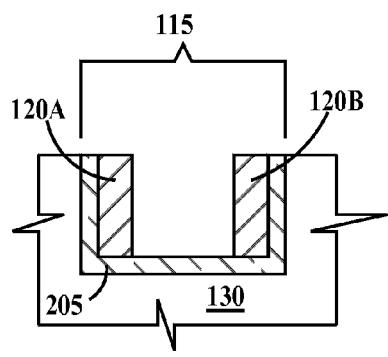

FIGS. 5A and 5B are a cross-section through a micro-channel according to embodiments of the present invention. In FIG. 5A, micro-channel 115 is a trench in supporting substrate 130 having a width W1 and a length D1. In one example, W1 is between about 1 micron and about 10 microns. In one example, D1 is between about 1 micron and about 10 microns. In one example, the width and depth of micro-channel 115 are at least 5 times the ER fluid particle size. If the width of the micro-channels becomes too large (e.g., exceeds about 50 microns), then the local temperature controlled regions become too large to reduce the otherwise large temperature gradients produced by circuits of the chip turning on and off without affecting the performance of those circuits. Electrodes 120A/B are formed in trenches 200 in supporting substrate 130. Trenches 200 have a dielectric liner to prevent cross-talk between different electrodes 120A/B. In FIG. 5B, electrodes 120A/B are formed within micro-channels 115 but isolated from supporting substrate 130 by dielectric liner 205.

Figure 6:
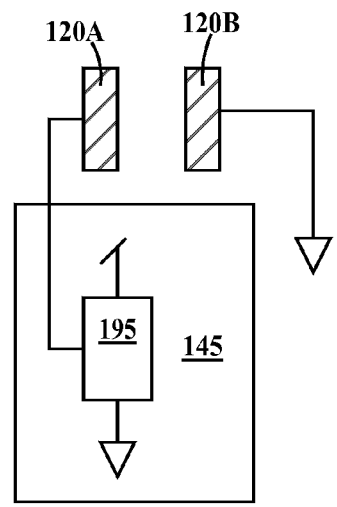
FIG. 6 is a circuit diagram for controlling the flow of electro-rheological fluid through the micro-channels of FIG. 4 according to embodiments of the present invention.
Figure 9:
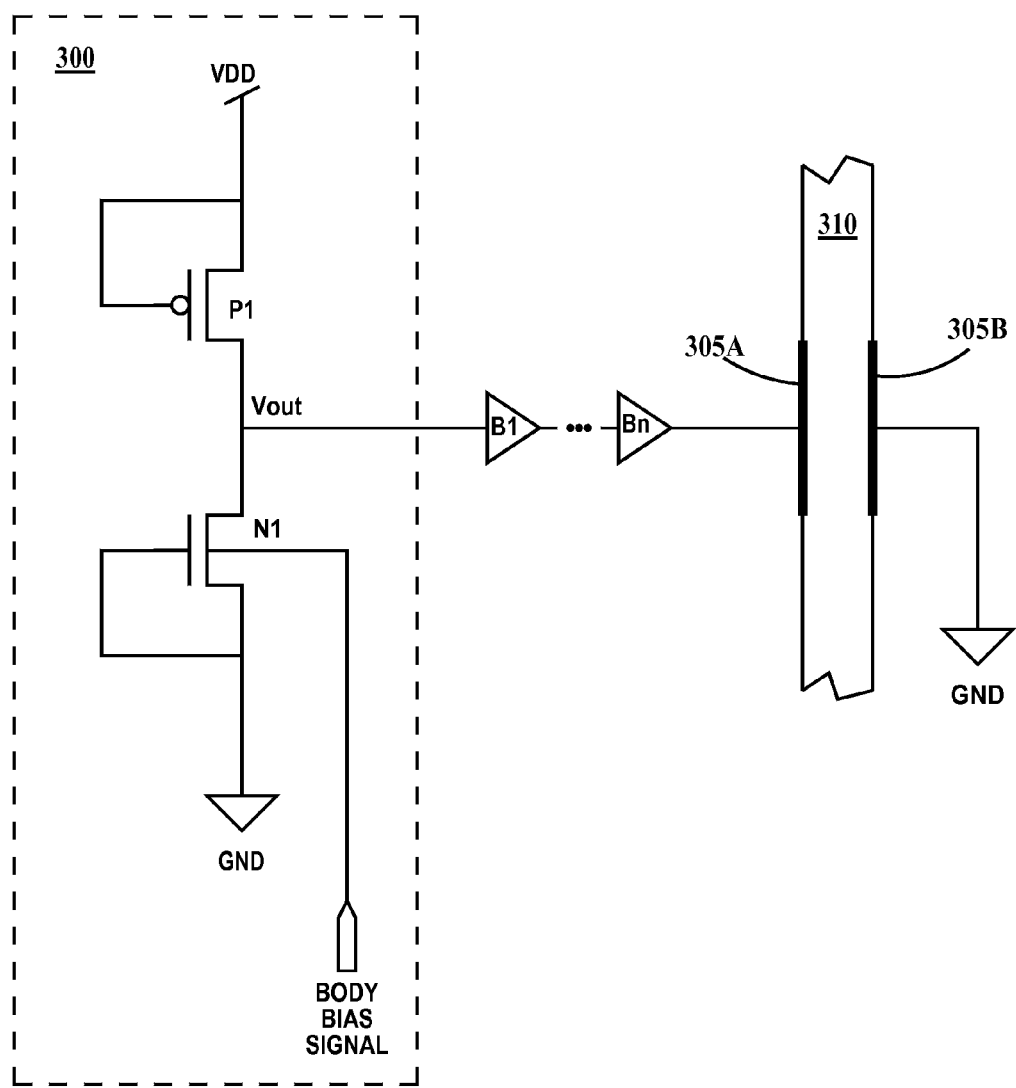
FIG. 9 is a schematic circuit diagram of an auto-temperature compensating circuit according to an embodiment of the present invention.
Figure 11:
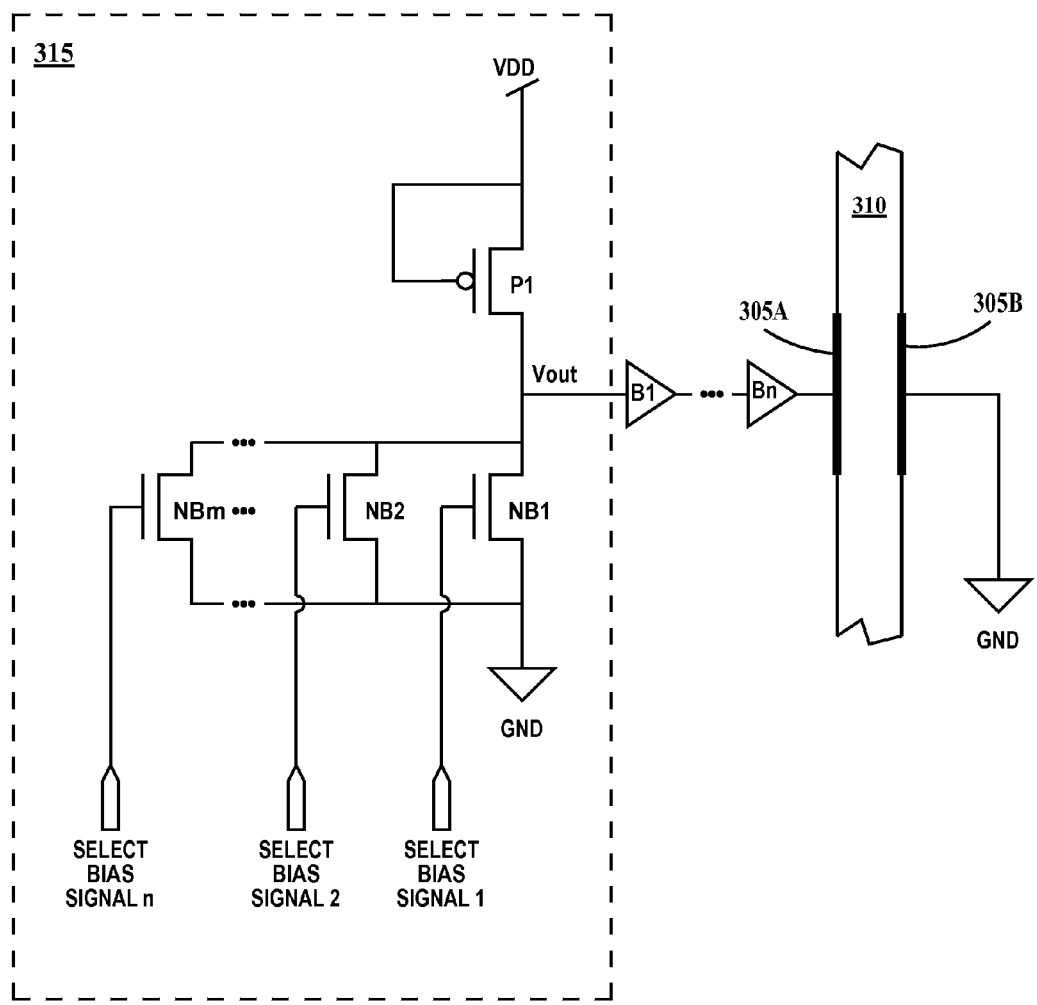
FIG. 11 is a schematic circuit diagram of an auto-temperature compensating circuit according to an embodiment of the present invention.

FIG. 6 is a circuit diagram for controlling the flow of ER fluid through the micro-channels of FIG. 4 according to embodiments of the present invention. In FIG. 6, auto-compensating temperature control circuit 195 is directly connected to electrodes 120A and electrode 120B is connected to ground (GND) (a zero voltage) or alternatively to VSS (which is a positive voltage between 0 volts and VDD). VDD is a positive voltage. Since the pair of channel electrodes can allow (turn-on) ER fluid flow or stop (turn-off) ER fluid flow, the channel electrodes 120A and 120B may be considered a "valve" and auto-compensating temperature control circuit 195 may be considered an "auto-compensating temperature valve controller." Examples of auto-compensating temperature control circuit 195 are illustrated in FIGS. 9 and 11 and described infra.

Figure 7:
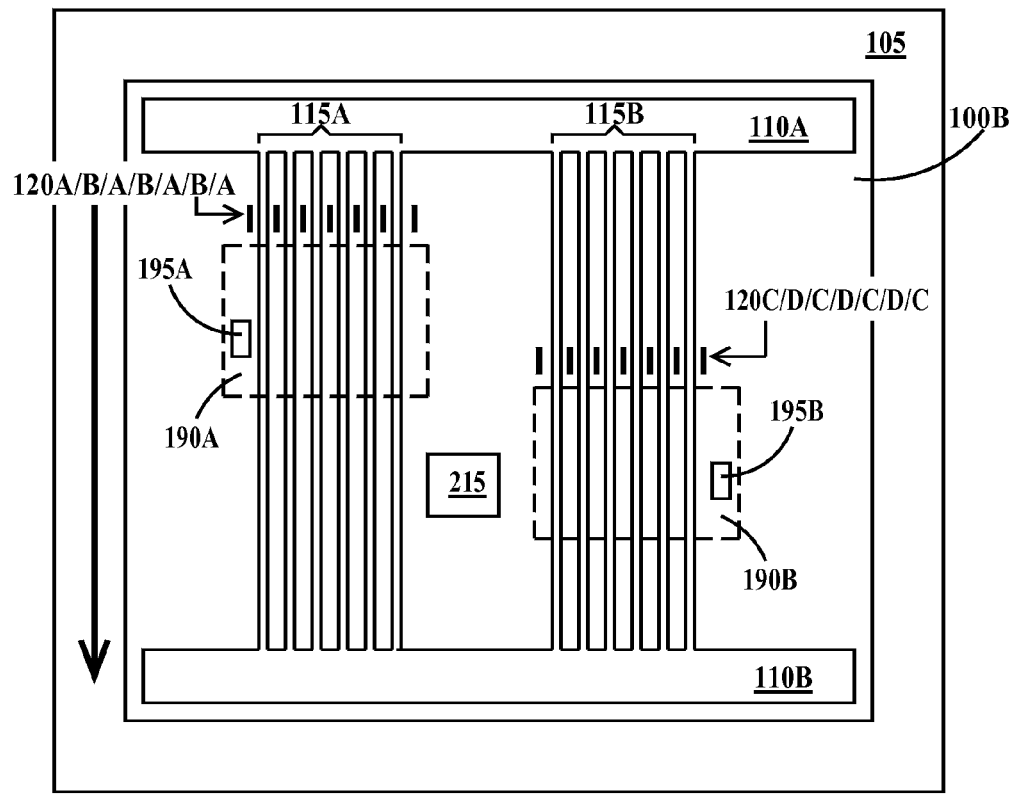
FIG. 7 is a top view of an exemplary micro-channel cooled integrated circuit according to an embodiment of the present invention.

FIG. 7 is a top view of an exemplary micro-channel cooled integrated circuit according to embodiments of the present invention. FIG. 7 gives an example, wherein micro-channels 115 are formed under a pair of circuits that are to be kept at the same temperature. In FIG. 7, an integrated circuit chip 110B includes a first functional circuit or first region 190A of integrated circuit chip 100 and auto-compensating temperature control circuit 195. There are multiple micro-channels 115A passing over functional circuit/region 190A. Multiple electrodes 120A and 120B alternate between micro-channels 115A. All the electrodes 120A are wired together and all the electrodes 120B are wired together so an electric field can be generated across all the micro-channels 115A simultaneously when a voltage differential is applied to the electrodes to shut off ER coolant fluid flow over functional circuit/region 190A. Also, in FIG. 7, integrated circuit chip 110B includes a second functional circuit or region 190B of integrated circuit chip 100. There are multiple micro-channels 115B passing over functional circuit 190B. Multiple electrodes 120C and 120D alternate between micro-channels 115B. All the electrodes 120C are wired together and all the electrodes 120D are wired together so an electric field can be generated across all the micro-channels 115B simultaneously when a voltage differential is applied to the electrodes to shut off ER coolant fluid flow over functional circuit 190B. Chip 100B also includes an auto-compensating temperature control circuit 215.

Figure 8:
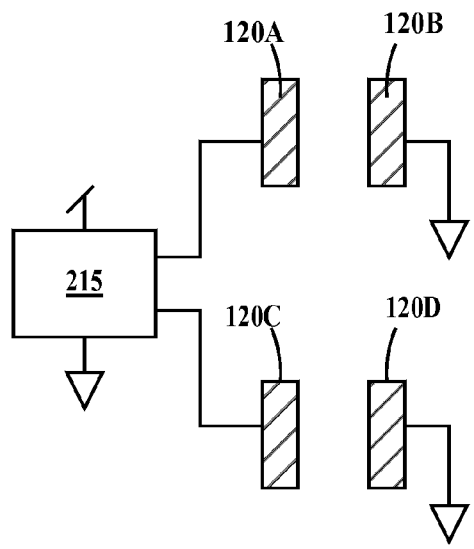
FIG. 8 is a circuit diagram of a circuit for controlling the flow of electro-rheological fluid through the micro-channels of FIG. 7 according to an embodiment of the present invention.
Figure 12:
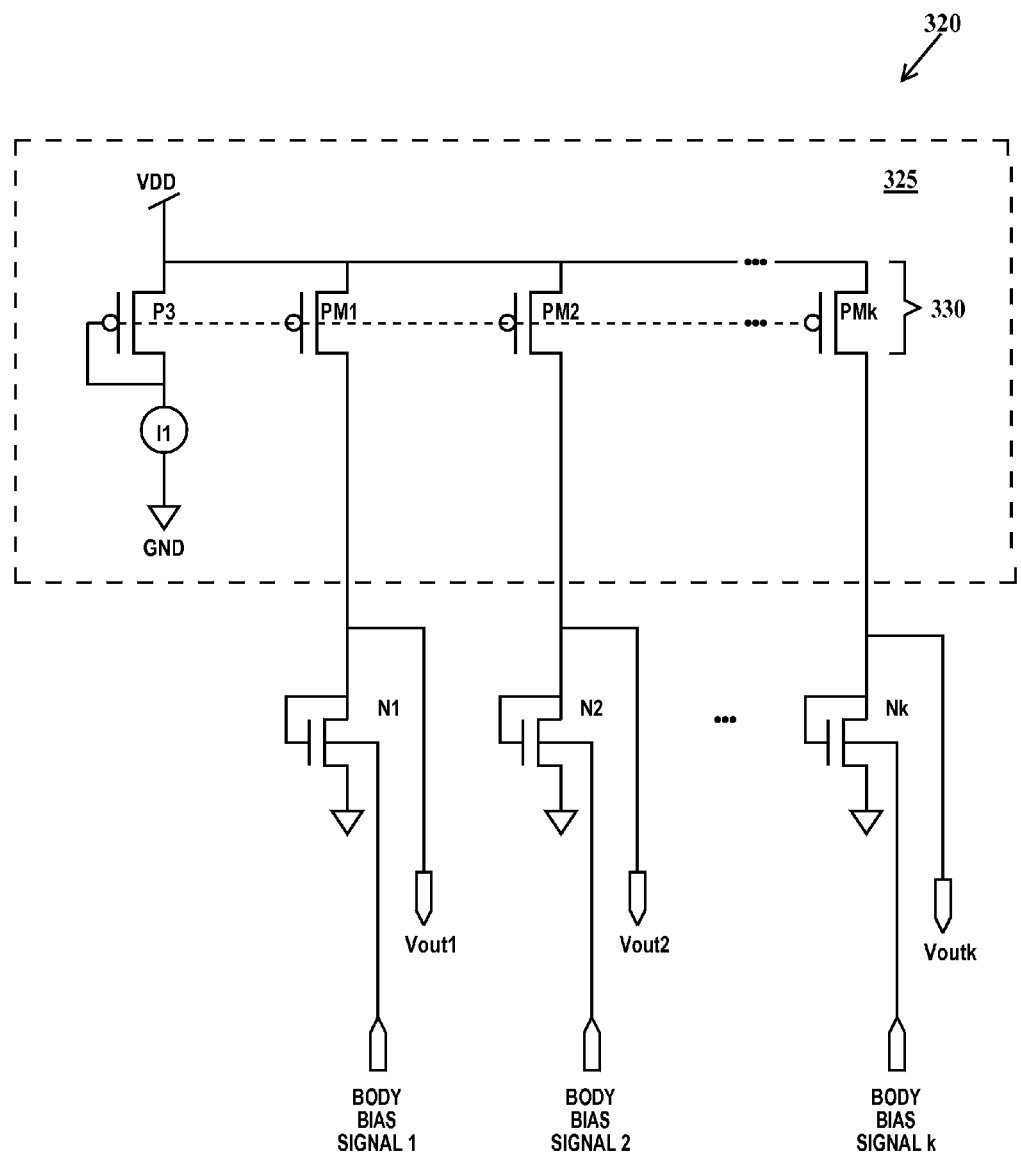
FIG. 12 is a schematic circuit diagram of an auto-temperature compensating circuit according to an embodiment of the present invention.

FIG. 8 is a circuit diagram of a circuit for controlling the flow of ER fluid through the micro-channels of FIG. 7 according to an embodiment of the present invention. In FIG. 8, auto-compensating temperature control circuit 215 is connected to channel electrodes 120A and 120C. Channel electrodes 120B and 120D are connected to GND (or VSS). Based on the temperature of auto-compensating temperature control circuit 215, VDD is applied to both channel electrodes 120A and 120C. Since the pairs of channel electrodes can allow (turn-on) ER fluid flow or stop (turn-off) ER fluid flow, the channel electrodes 120A/120B and 120C/120D may be considered "valves" and auto-compensating temperature control circuit 215 may be considered an "auto-compensating temperature valve controller." An example of auto-compensating temperature control circuit 215 is illustrated in FIG. 12 and described infra.

The connections between temperature sensors, control circuits and electrodes described supra with reference to FIGS. 6 and 8 may be made (i) by conductive vias extending from the temperature sensor/control circuit through the chip or (ii) by connections made through the carrier (e.g., carrier 105 of FIGS. 1B, 2B, 3B) to the lid (e.g., 165 of FIG. 1B, 165B of FIGS. 2A and 3A) then to the electrodes (120A/120B of FIG. 4.

FIG. 9 is a schematic circuit diagram of an auto-temperature compensating circuit according to an embodiment of the present invention. In FIG. 9, an auto-compensating temperature control circuit 300 includes a PFET P1 and an NFET N1. The source and gate of PFET P1 is connected to VDD (a positive voltage rail) and the drain of PFET P1 is connected to a node Vout. The source and gate of NFET N1 is connected to GND or alternatively to VSS. The body of NFET N1 is connected to a body bias signal (which is a positive voltage source). The body bias signal may be a fixed voltage or may an adjustable voltage. Vout is connected to a first channel electrode 305A through an optional series of n non-inverting buffers B(n) where n is an integer greater than 1. Alternatively, Vout is connected directly to first channel electrode 305A. A second channel electrode 305B is connected to GND (or VSS). First and second channel electrodes 305A and 305B are physically located on opposite sides of micro channel 310 in a similar manner as electrodes 120A and 120B if FIGS. 5A and 5B described supra.

Figure 10:
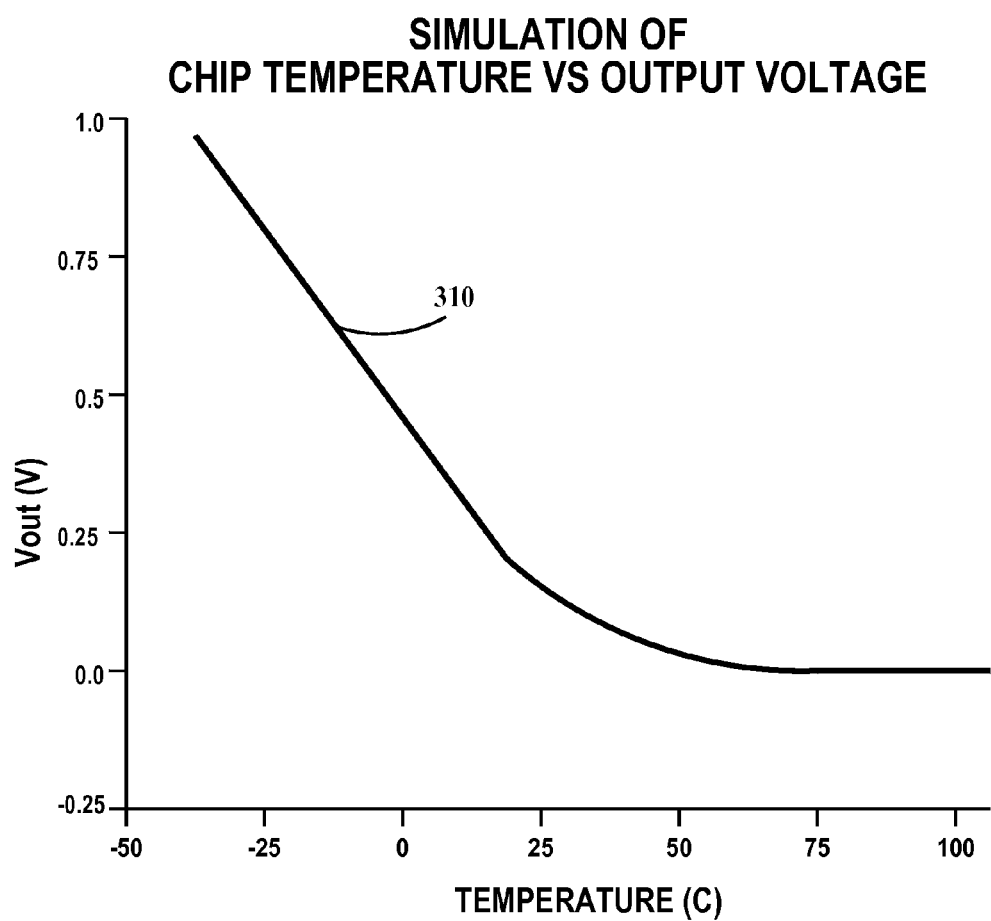
FIG. 10 is a simulation of output voltage versus temperature of the circuit of FIG. 9.

In operation, PFET P1 acts as a temperature stable current source and NFET N1 as a temperature sensor. Leakage through PFET P1 is essentially temperate insensitive. What small leakage temperature sensitivity there is will not effect the operation of the circuit. Leakage through PFET P1 tries to pull Vout up while temperature sensitive leakage through NFET N1 increases as temperature increases and tries to pull Vout down. Increasing positive body bias increases the leakage through NFET N1, so the body bias control determines the voltage on Vout. With zero volts on Vout, there is no electric field between first and second channel electrodes 305A and 305B and ER fluid can flow through channel 310. With VDD on Vout, there is an electric field between first and second channel electrodes 305A and 305B and ER fluid can not flow through channel 310. The actual voltage on Vout is a function of the temperature of NFET N1 as illustrated in FIG. 10 and described infra. The body bias signal supplies a variable voltage that always keeps NFET N1 in pinch-off mode. NFET N1 must be held in pinch-off mode because as NFET N1 starts to turn on the resultant sub-threshold leakage is no longer as temperature sensitive and Vout control would be lost. Buffers B(n) insert a delay between changing the voltage at node Vout and applying the new Vout voltage to the channel electrodes. The value of the body bias signal voltage sets the temperature for the local region of the integrated circuit chip (see, for example, circuit/region 190 of FIG. 4) that contains circuit 300.

PFET P1 is an example of a temperature stable current source. Alternatively, PFET P1 can be replaced with a bandgap voltage source which is more insensitive to temperature than PFET P1; the output of the bandgap voltage source connected to Vout.

FIG. 10 is a simulation of output voltage versus temperature of the circuit of FIG. 9. In FIG. 10 curve 310 represents Vout as a function of the temperature of circuit 300 of FIG. 9. Vout is zero volts at temperatures above about 50° C. and there is no electric field between the channel electrodes 305A and 305B (see FIG. 9) allowing ER fluid flow in channel 310 (see FIG. 9). At temperatures between about 50° C. and about 25° C. Vout is between about 0.5 volts and about 0.2 volts which may generate an electric field strong enough to reduce or stop ER fluid flow depending upon the ER fluid being used. At temperatures below about 25° C. Vout is 0.25 volts or higher and ideally the electric field on the channel electrodes should gel the ER fluid, stopping local cooling.

FIG. 11 is a schematic circuit diagram of an auto-temperature compensating circuit according to an embodiment of the present invention. FIG. 11 is similar to FIG. 9 except auto-compensating temperature control circuit 300 is replaced with auto-compensating temperature control circuit 315 in which NFET N1 of FIG. 9 is replaced with a set of m parallel NFETs NM(m) where m is an integer equal to or greater than 2. The drains of NFETs NM(m) are connected to node Vout. The sources of NFETs NB(m) are connected to GND (or VSS). Respective gates of NFETs NB(m) are connected to respective and independent Select Bias Signals. There is no body bias to any of NFETs NB(m). The select bias signals selectively supply a voltage between zero and less than the pinch-off voltage of the transistor so as to control the leakage current through the transistor. The maximum voltage of the select bias signals (n) must be a voltage below pinch off, as above the pinch-off voltage, the transistors start to turn on and the resultant sub-threshold leakage is no longer as temperature sensitive and Vout control would be lost. Thus, the more NFETs NM(n) to which a non-zero voltage (not less than the pinch off voltage) is applied to the gate, the harder Vout is pulled to GND (or VSS). NFETs NM(m) and the corresponding select bias signals comprise a vernier control for Vout.

In operation, as in FIG. 10, leakage through PFET P1 tries to pulls Vout up while temperature sensitive leakage through NFET N1 increases as temperature increases and tries to pull Vout down. Using the select bias signals, one or more of NFETs NB(m) can be turned on, pulling node Vout down. As more of NFETs NB(m) are turned on, the harder Vout is pulled down. The actual voltage on Vout is a function of the temperature of NFETS NB(m) and the number of NFETs NB(m) turned on. The number of NFETs NB(m) turned on sets the temperature for the functional circuits or local region of the integrated circuit chip.

FIG. 12 is a schematic circuit diagram of an auto-temperature compensating circuit according to an embodiment of the present invention. In FIG. 12, an auto-compensating temperature control circuit 320 includes a temperature stable current source 325 comprising a current mirror 330 and a temperature compensated current source I1. Current mirror 330 comprises PFET P3 and k current mirror PFETs PM(k), where k is an integer equal to or greater than 1. The sources of PFET P3 and PFETs PM(k) are connected to VDD. The gates of PFET P1 and PFETs PM(k) are connected to GND (or VSS) through temperature compensated current source I1. In one example, current source I1 is a bandgap voltage source. The drain of PFET P3 is connected to the gate of PFET 3 and to GND through current source I1. The drains of the k current mirrors PFETs PM(k) are k connected to respective sources of NFETs N(k) and to respective Vouts(k). Each Vout(k) is connected to a corresponding first channel electrode of a pair of channel electrodes (not shown, see for example, FIG. 9); the second channel electrode of the pair of channel electrodes is connected to GND (or VSS) (not shown, see for example, FIG. 9).

The operation of auto-compensating temperature control circuit 320 is similar to that of auto-compensating temperature control circuit 300 of FIG. 9. Alternatively, each of the NFETs (k) can be replaced a set of NFETs NB(n) as in auto-compensating temperature control circuit 315 of FIG. 11 and the operation would be similar to that of auto-compensating temperature control circuit 315.

Thus, the embodiments of the present invention provide circuits to automatically control the local flow of electro-rheological cooling fluids in micro-channels of integrated circuits in response to local integrated circuit temperatures.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
an integrated circuit chip having a set of micro-channels;
an electro-rheological coolant fluid filling said micro-channels;
first and second parallel channel electrodes on opposite sides of at least one micro-channel, said first channel electrode connected to an output of an auto-compensating temperature control circuit, said second channel electrode connected to ground;
said auto-compensating temperature control circuit comprising a temperature stable current source connected between a positive voltage rail and said output and having a temperature sensitive circuit connected between ground and said output, a leakage current of said temperature stable current source being essentially insensitive to temperature and a leakage current of said temperature sensitive circuit increasing with temperature; and a body bias signal connected to a temperature set input of said temperature sensitive circuit.

2. The structure of claim 1, wherein said temperature stable current source comprises a PFET, a gate and a source of said PFET connected to said positive voltage rail and a drain of said PFET connected to said output.

3. The structure of claim 1, wherein said temperature stable current source comprises a bandgap voltage source, an output of said bandgap voltage source connected to said output.

4. The structure of claim 1, wherein said temperature sensitive current source is an NFET biased below pinch-off, a drain of said NFET connected to said output, a gate and a source of said NFET connected to ground and a body of said NFET connected to said body bias voltage signal.

5. The structure of claim 1, wherein said temperature sensitive current source comprises a set of n NFETs, each NFET of said set of NFETs biased below pinch off, drain of each NFET of said set of NFETs connected to said output, a source of each NFET of said set of NFETs connected to ground and a gate each NFET of said set of said NFETs connected to said bias voltage signal.

6. The structure of claim 1, wherein:
said temperature stable current source comprises a PFET and one or more current mirror PFETS, sources of said PFET and said one more mirror PFETs connected to said positive voltage rail, gates of said PFET and said mirror PFETs and a drain of said PFET connected to ground through a temperature compensated current source, drains of said one or more mirror PFETs connected to a respective output of said auto-compensating temperature control circuit; and
said temperature stable current source comprises a PFET, a gate of and as source of said PFET connected to said positive voltage rail and a drain of said PFET connected to said output.

7. The structure of claim 1, said integrated circuit chip having a first region abutting a first surface of said integrated circuit chip opposite from second surface of said integrated circuit chip abutting a second region of said integrated circuit chip, said first region including said micro-channels and said second region including functional circuits and said auto-compensating temperature control circuit.

8. The structure of claim 1, including a first electro-rheological coolant fluid reservoir formed in a first end of said first region and a second electro-rheological coolant fluid reservoir formed in a second and opposite end of said first region, said micro-channels connecting said first electro-rheological coolant fluid reservoir to said second electro-rheological coolant fluid reservoir.

9. The structure of claim 1, wherein said micro-channels are formed only over selected regions of said integrated circuit chip.

10. The structure of claim 1, said integrated circuit chip having a first region abutting a first surface of said integrated circuit chip opposite from second surface of said integrated circuit chip abutting a second region of said integrated circuit chip, said first region including said micro-channels and said second region including functional circuits and said auto-compensating temperature control circuit; and
a Peltier device or a heat sink mounted to said first surface.

11. A method, comprising
providing an integrated circuit chip comprising:
a set of micro-channels;
an electro-rheological coolant fluid filling said micro-channels;
first and second parallel channel electrodes on opposite sides of at least one micro-channel, said first channel electrode connected to an output of an auto-compensating temperature control circuit, said second channel electrode connected to ground; and
said auto-compensating temperature control circuit comprising a temperature stable current source connected between a positive voltage rail and said output and having a temperature sensitive circuit connected between ground and said output, a leakage current of said temperature stable current source being essentially insensitive to temperature and a leakage current of said temperature sensitive circuit increasing with temperature; and
a body bias signal connected to a temperature set input of said temperature sensitive circuit; and
adjusting the flow of electro-rheological coolant fluid automatically based on the temperature of said auto-compensating temperature control circuit.

12. The method of claim 11, wherein said temperature stable current source comprises a PFET, a gate and a source of said PFET connected to said positive voltage rail and a drain of said PFET connected to said output.

13. The method of claim 11, wherein said temperature stable current source comprises a bandgap voltage source, an output of said bandgap voltage source connected to said output.

14. The method of claim 11, wherein said temperature sensitive current source is an NFET biased below pinch-off, a drain of said NFET connected to said output, a gate and a source of said NFET connected to ground and a body of said NFET connected to said body bias voltage signal.

15. The method of claim 11, wherein said temperature sensitive current source comprises a set of n NFETs, each NFET of said set of NFETs biased below pinch off, drain of each NFET of said set of NFETs connected to said output, a source of each NFET of said set of NFETs connected to ground and a gate each NFET of said set of said NFETs connected to said bias voltage signal.

16. The method of claim 11, wherein:
said temperature stable current source comprises a PFET and one or more current mirror PFETS, sources of said PFET and said one more mirror PFETs connected to said positive voltage rail, gates of said PFET and said mirror PFETs and a drain of said PFET connected to ground through a temperature compensated current source, drains of said one or more mirror PFETs connected to a respective output of said auto-compensating temperature control circuit; and
said temperature stable current source comprises a PFET, a gate of and as source of said PFET connected to said positive voltage rail and a drain of said PFET connected to said output.

17. The method of claim 11, wherein said integrated circuit chip includes:
a first region abutting a first surface of said integrated circuit chip opposite from second surface of said integrated circuit chip abutting a second region of said integrated circuit chip, said first region including said micro-channels and said second region including functional circuits and said auto-compensating temperature control circuit.

18. The method of claim 11, wherein said integrated circuit chip includes:
a first electro-rheological coolant fluid reservoir formed in a first end of said first region and a second electro-rheological coolant fluid reservoir formed in a second and opposite end of said first region, said micro-channels connecting said first electro-rheological coolant fluid reservoir to said second electro-rheological coolant fluid reservoir.

19. The method of claim 11, wherein said integrated circuit chip includes:
   said micro-channels only over selected regions of said integrated circuit chip.

20. The method of claim 11, wherein said integrated circuit chip includes:
   a first region abutting a first surface of said integrated circuit chip opposite from second surface of said integrated circuit chip abutting a second region of said integrated circuit chip, said first region including said micro-channels and said second region including functional circuits and said auto-compensating temperature control circuit; and
   a Peltier device or a heat sink mounted to said first surface.

\* \* \* \* \*